United States Patent [19]
Shen

[11] Patent Number: 5,815,452
[45] Date of Patent: Sep. 29, 1998

[54] HIGH-SPEED ASYNCHRONOUS MEMORY WITH CURRENT-SENSING SENSE AMPLIFIERS

[75] Inventor: David H. Shen, Saratoga, Calif.

[73] Assignee: Enable Semiconductor, Inc., Milpitas, Calif.

[21] Appl. No.: 873,326

[22] Filed: Jun. 12, 1997

[51] Int. Cl.$^6$ .................................................... G11C 7/06
[52] U.S. Cl. ...................... 365/207; 365/189.07; 365/190
[58] Field of Search .............................. 365/207, 189.07, 365/190

[56] References Cited

U.S. PATENT DOCUMENTS

| | | | |
|---|---|---|---|
| 4,328,511 | 5/1982 | Tasch et al. | 357/41 |
| 4,541,077 | 9/1985 | Rapp | 365/210 |
| 4,651,302 | 3/1987 | Kimmel et al. | 365/104 |
| 5,163,022 | 11/1992 | Homma et al. | 365/190 |
| 5,181,205 | 1/1993 | Kertis | 371/21.1 |
| 5,247,479 | 9/1993 | Young | 365/189.05 |
| 5,253,197 | 10/1993 | Suzuki et al. | 365/49 |
| 5,297,093 | 3/1994 | Coffman | 365/208 |
| 5,301,158 | 4/1994 | Yokomizo | 365/207 |
| 5,317,218 | 5/1994 | Liu | 365/207 |
| 5,327,394 | 7/1994 | Green et al. | 365/233.5 |
| 5,384,503 | 1/1995 | Shu et al. | 327/52 |
| 5,388,068 | 2/1995 | Ghoshal et al. | 365/162 |
| 5,467,312 | 11/1995 | Albon et al. | 365/189.01 |
| 5,469,378 | 11/1995 | Albon et al. | 365/49 |
| 5,483,489 | 1/1996 | McClure | 365/189.11 |
| 5,561,629 | 10/1996 | Curd | 365/185.21 |
| 5,563,527 | 10/1996 | Diba | 326/38 |
| 5,563,835 | 10/1996 | Oldham | 365/207 |
| 5,565,791 | 10/1996 | Raza | 326/38 |
| 5,566,112 | 10/1996 | Lysinger | 365/196 |
| 5,570,316 | 10/1996 | Lysinger | 365/196 |
| 5,654,928 | 8/1997 | Lee et al. | 365/207 |
| 5,663,915 | 9/1997 | Mobley | 365/207 |

*Primary Examiner*—Tan T. Nguyen
*Attorney, Agent, or Firm*—Carr & Ferrell LLP

[57] ABSTRACT

A high-speed current-sensing amplifier using process-insensitive matching of devices to determine the state of a bistable SRAM cell. The benefits include small voltage swings on heavily capacitively loaded bit lines and bit line bars during memory sensing, thereby maximizing the speed of the SRAM device. One embodiment uses a negative feedback amplifier minimize the bit line and bit line bar voltage swings while sensing current through matched PMOS transistors. Another embodiment uses cascoded PMOS devices to limit the swing of the bit lines and bit line bars, and a supply voltage and process-compensated voltage reference source to set the common-mode voltage of matched resistive sense elements. In all cases power on and off circuitry minimize the power of the memory device.

18 Claims, 5 Drawing Sheets

HIGH-SPEED ASYNCHRONOUS MEMORY WITH CURRENT-SENSING SENSE AMPLIFIERS

BACKGROUND OF THE INVENTION

1. Field of the Invention

This invention relates generally to semiconductor memories, and more specifically to memories with high speed sense amplifiers.

2. Discussion of the Prior Art

Conventional read/write semiconductor memories typically store binary digits (bits) either by charging a capacitor (dynamic random access memory or DRAM) or by setting a bistable transistor pair for high speed (static random access memory or SRAM) memories. When a read cycle is initiated in the latter kind of memory, the bistable pair being accessed sinks current from one of the lines on its opposite sides, "bit line" and its logical complement "bit line bar." A sense amplifier detects the small voltage or current difference between bit line and bit line bar and converts the difference signal into a full-swing digital signal.

Sense amplifiers are usually voltage amplifiers, primarily because semiconductor designs commonly use metal oxide semiconductor (MOS) transistors, which have drain currents proportional to the voltage between the source and gate. This is in contrast to bipolar junction transistors which have collector currents proportional to their base currents.

Another reason that sense amplifiers have traditionally been voltage amplifiers is that voltage amplifiers can be easily enabled only after a memory address change, and thus require no power when addresses are not changing. Limiting power consumption is an important goal not only in portable electronic devices but in all electronic devices, because integrated circuits have limited heat-dissipation capabilities. Furthermore, by enabling the sense amplifiers after the voltage difference between bit line and bit line bar is large (around 200 mV), there is very little sensitivity to mismatches in the transistors of the sense amplifier.

However, voltage sense amplifiers slow memory access speeds, because the sensed voltage difference on bit line and bit line bar must be a substantial amount (around 200 mV) in order to overcome the offsets due to mismatches in the sense amplifier transistors. Swinging the bit lines a substantial amount requires the time-consuming charging of parasitic capacitances. As microprocessor speeds have exceeded 200 MHz, the requirement for cache memory maximum access times has dropped below 5 nanoseconds. This is not feasible to do with some existing voltage sense amplifier designs.

Current sense amplifiers allow the current being drawn into the memory cell to be sensed, while keeping the swing on the bit lines small (around 50 mV). This allows the access time to be improved over the voltage sense amplifiers. Some current sense amplifiers have used an n-channel MOS (NMOS) transistor in conjunction with negative feedback of an operational amplifier, and a p-channel MOS (PMOS) column pull-up transistor. A reference for this design is *A 6-ns CMOS SRAM with Offset-Voltage-Insensitive Current Sense Amplifiers, Ishibashi,* et al., IEEE Journal of Solid-State Circuits, Vol. 30, No. 4, April 1995 at pages 480–486. FIG. 1 shows such a prior art current-sensing sense amplifier 2 in conjunction with a bistable latched memory element 4. Within memory element 4, an exemplary bistable latched memory cell 6 is maintained in its latched state by PMOS pull-up transistors 8 and 10. The transistors which make up memory cell 6 have parasitic resistances which are shown as discrete resistors 14 and 16, and parasitic capacitances which are shown as discrete capacitors 18 and 20. The available output lines of memory cell 6 are called bit line at node 22 and the logical complement bit line bar at node 24. These are connected through column switches 26 and 28, respectively, to sense amplifier 2. Many other memory cells (not shown) may be multiplexed through additional column switches (not shown) to the sense amplifier 2. One additional pair of column switches is shown at 30 and 31 as an example.

The pull-up transistors 8 and 10 each source a constant current of approximately 200 microamps. To illustrate the circuit's functioning, consider the case in memory cell 6 when the transistor which conducts current from bit line 22 is turned on and the transistor which conducts current from bit line bar 24 is turned off. In this case, parasitic resistance 14 draws about 100 microamps through memory cell 6 to ground, leaving only 100 microamps of the 200 microamps sourced through pull-up PMOS transistor 8 to flow through column switch 26. Since the transistor conducting current from bit line bar 24 is turned off, all 200 microamps sourced through column pull-up transistor 10 is available to flow through column switch 28. Thus, ideally there exists a difference of 100 microamps between the current flowing in bit line 22 and the current flowing in bit line bar 24.

The current flowing through column switches 26 and 28 must pass through NMOS transistors 32 and 34, as the input terminals of operational amplifiers 36 and 38 have a very high impedance. The drain nodes 40 and 42 at NMOS transistors 32 and 34 are kept near reference voltage Vref1 by the feedback action of operational amplifiers 36 and 38. If, for example, the voltage at node 40 is greater than Vref1, then the output voltage of operational amplifier 36 will be somewhat positive. This output voltage applied to the gate of NMOS transistor 32 lowers the drain-source resistance, which in turn lowers the voltage at node 40. Conversely, if the voltage at node 40 is less than Vref1, then the output voltage of operational amplifier 36 will be somewhat negative. This output voltage applied to the gate of NMOS transistor 32 raises the drain-source resistance, which in turn raises the voltage at node 40. In either case, this feedback effect continues until equilibrium is reached with the voltage at node 40 being only slightly greater than Vref1.

Because of the difference in the currents flowing in bit line 22 and bit line bar 24, the equilibrium points reached by the NMOS transistors'drain nodes 40 and 42 will be different, with the node corresponding to the higher current reaching a higher voltage. If, for example, bit line bar 24 has greater current than bit line 22, then node 42 will be slightly more positive than node 40. This equilibrium will be reached when the output voltage of operational amplifier 38 is higher than that of operational amplifier 36. This small voltage difference is enough to be sensed by a voltage comparator 44 having moderate gain. Continuing in the example, if bit line bar 24 carries more current than bit line 22, then the voltage at the non-inverting input terminal of voltage comparator 44 will be higher than that at the inverting input terminal, and hence the digital output signal of voltage comparator 44 will be HIGH. To summarize, the FIG. 1 circuit compares the currents in bit line 22 and in bit line bar 24, caused by the latched state of memory cell 6, and creates a digital signal representative of this latched state at the output terminal of voltage comparator 44.

There are several problems associated with this design. The primary problem is that the current characteristics of column pull-up PMOS transistors 8 and 10 and of current-sensing NMOS transistors 32 and 34 must be matched, and fabrication process variations make it difficult to match PMOS and NMOS transistors. The matching between the PMOS and NMOS transistors is needed to keep the common-mode voltage at nodes 46 and 48 (inputs to comparator 44) at a reasonable level so that it can be accurately sensed. A second problem is that mismatches in the transistors in amplifiers 36 and 38 contribute to voltage offsets at nodes 40 and 42, which introduce offset currents in transistors 8 and 10. These offsets can prevent the sense amplifier from correctly sensing the state of the memory cell 6. A third problem is that mismatches in NMOS transistors 32 and 34 directly introduce offset currents that subtract from the ability to sense current from memory cell 6. These offset currents cause the sense amplifier to incorrectly sense the state of the memory cell 6.

More detailed information on semiconductor memories in general may be found in a text by Betty Prince, *Semiconductor Memories*, John Wiley and Sons (2nd edition 1991).

There remains a need, therefore, for a memory sense amplifier which uses column pull-up and current-sensing transistors having matched current characteristics and which operates at higher speeds with lower power consumption.

SUMMARY OF THE INVENTION

The present invention uses a current-sensing, rather than a voltage-sensing, sense amplifier to increase the speed of a memory. The current-sensing sense amplifier avoids several of the problems associated with using previous current-sensing sense amplifiers in memories.

The current-sensing amplifier in two embodiments of the invention each have identical circuits consisting of an operational amplifier with a negative feedback loop to a PMOS transistor. Each operational amplifier has its positive input connected to a voltage reference Vref1, which is close in magnitude to the column pull-up voltage Vcc. The operational amplifier feedback holds the PMOS transistor source voltages close to Vref1 and hence close to Vcc. Since there is little swing in the source voltage, there is little delay due to stray capacitance.

The small voltage difference between the outputs of the two operational amplifiers, on the bit lines and on the bit line bars, is sufficient to drive a voltage comparator of moderate gain. The voltage comparator output is a digital signal representing the value of the stored bit.

To overcome the high power consumption associated with using current sense amplifiers, in these two embodiments of the invention the operational amplifiers have an enable input which allows the operational amplifiers to be turned off when the associated columns are not being accessed. There are preferably many such pairs of operational amplifiers, so only one of many pairs being powered on at any given time reduces overall power consumption.

The invention's use of PMOS transistors in the negative feedback loops of the operational amplifiers has advantages over the use of NMOS transistors found in earlier current sense amplifier designs. Since the column pull-up current source usually has been a PMOS transistor, it is much easier to manufacture an adequately matched pair of PMOS transistors for both the feedback loop and column pull-up transistors than to try to match a NMOS transistor for the feedback loop and a PMOS transistor for the column pull-up.

Another embodiment of the invention reduces the current offsets caused by mismatches in the feedback amplifiers and sense transistors. The insensitivity to process variations is improved because of two factors concerning mismatches. The first factor is that having fewer transistors in the circuit introduces fewer offsets. The second factor is that resistors can be matched better than transistors. By replacing the feedback amplifiers with strong cascoded PMOS transistors, the number of transistors is substantially reduced and current offsets are improved. In addition, current sensing is performed through matched resistors, which can be matched with tighter tolerances than transistors. A precision process-compensated source for reference voltage Vref3 is needed to control the common-mode voltage at the non-grounded end of the matched resistors so that the currents can be correctly sensed. Controlling the current through the PMOS sense transistors to limit the swing of the voltages on the bit lines is accomplished in the first two embodiments by the use of negative feedback amplifiers. In the third embodiment cascoded PMOS transistors provide the negative feedback needed to hold the bit lines steady.

DETAILED DESCRIPTION OF THE INVENTION

Figure 2:
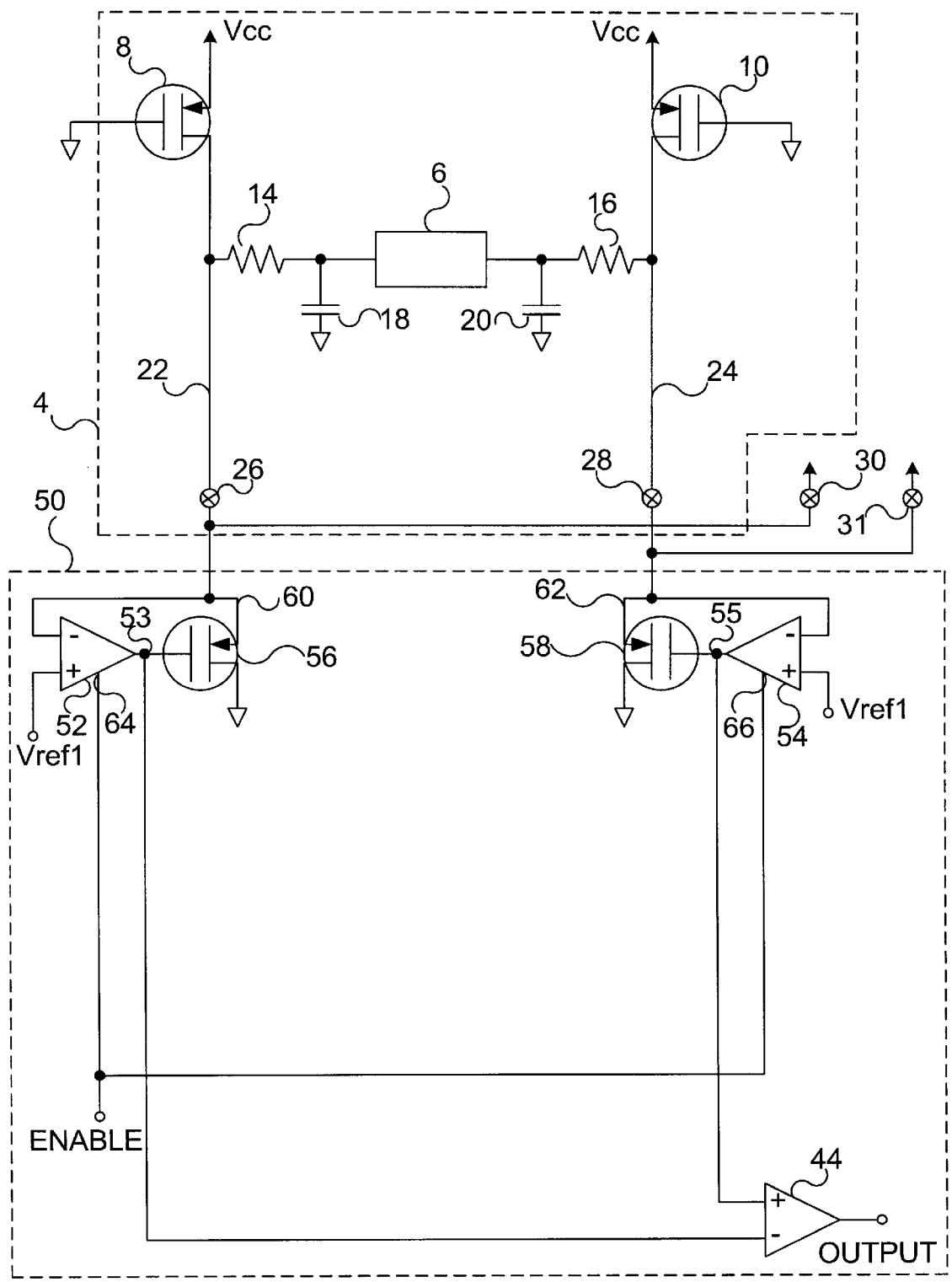
FIG. 2 shows a first embodiment of the invention.

FIG. 2 shows the invention in a first embodiment as a current-sensing sense amplifier 50 in conjunction with a bistable latched memory element 4. Inside sense amplifier 50, operational amplifiers 52 and 54 have their non-inverting inputs connected to a fixed voltage reference Vref1. PMOS transistors 56 and 58 have their source nodes 60 and 62 connected in negative feedback loops to the inverting inputs of operational amplifiers 52 and 54 respectively, which holds nodes 60 and 62 relatively close to Vref1. The operational amplifier 52 and 54 outputs 53 and 55 are connected to the gates of PMOS transistors 56 and 58, respectively.

Again, as assumed above to illustrate the prior art circuit's functioning, consider the case when the transistor in memory cell 6 (not shown) which conducts current from bit line 22 is turned on and the transistor which conducts current from bit line bar 24 is turned off. In this case PMOS transistor 58 will have to sink 200 microamps but PMOS transistor 56 will only have to sink about 100 microamps. Consequently the operational amplifier 54 output will be at a slightly higher voltage than the operational amplifier 52 output. This small voltage difference corresponds to a buffered measurement of the differences between the currents in bit line 22 and in bit line bar 24. Since the voltages at nodes 60 and 62 move only very slightly from Vref1, the parasitic capacitances 18 and 20 do not slow sensing the state of memory cell 6.

Voltage comparator 44 has its inverting and non-inverting inputs connected to the outputs 53 and 55 of the operational amplifiers 52 and 54, respectively. The state of comparator 44 thus corresponds to whether bit line 22 conducts more or less current than does bit line bar 24. The output of comparator 44 is a buffered memory data signal available for use in subsequent digital circuits.

Figure 1:
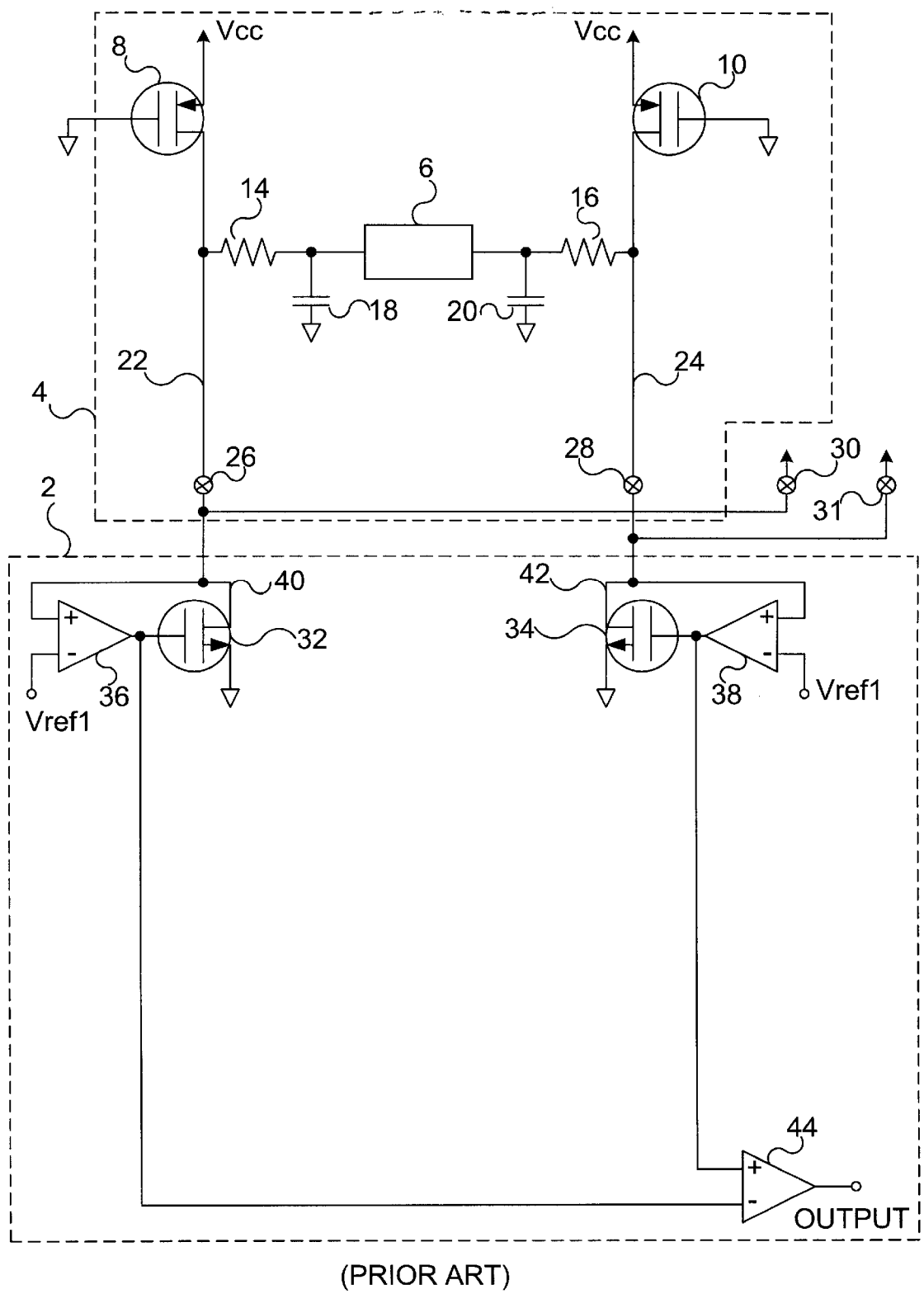
FIG. 1 shows a prior art current-sensing amplifier in a static random access memory.

Because sense amplifier 50 uses current sensing rather than voltage sensing, there are no large voltage swings around Vref1 at nodes 60 and 62, and therefore sensing is much faster (between 2 and 3 nanoseconds) than in a conventional voltage sensing sense amplifier (approximately 5 nanoseconds). The use of the PMOS transistors 56 and 58 rather than the corresponding NMOS transistors 32 and 34 in prior art FIG. 1 brings about this speed increase while avoiding the above-described problems inherent in the NMOS design. As mentioned above, it is necessary to have column pull-up PMOS transistors 8 and 10 match current characteristics with current-sensing PMOS transistors 56 and 58. The use of PMOS transistors for both functions allows the common-mode voltage on nodes 53 and 55 to be well-controlled across unavoidable process variations. This guarantees that the voltage difference at nodes 53 and 55 can be correctly sensed by comparator 44.

This increase in speed incurs the cost of an increase in power consumed by operational amplifiers 52 and 54. A second feature of the present invention is the use of enable input lines 64 and 66 with operational amplifiers 52 and 54 which allows powering down the amplifiers when their memory cell columns are not being accessed. There are many such sense amplifiers in a memory device, but since only one sense amplifier is powered on at a time, the power dissipation of the sense amplifiers is minimized.

Turning operational amplifiers 52 and 54 on and off introduces another potential problem for sense amplifier 50. When operational amplifiers 52 and 54 are powered off, PMOS transistors 56 and 58 stop conducting and the voltage at nodes 60 and 62 floats up close to the device power supply and column pull-up voltage Vcc. There will be a time delay associated with pulling these nodes down from Vcc to Vref1. For this reason optimal performance occurs when Vref1 is close to Vcc. Experiments have shown that Vref1 selected according to the formula Vref1=Vcc−0.2 volts yields the best device performance.

Even with the above choice of Vref1, there is still a time delay associated with powering on operational amplifiers 52 and 54. The PMOS transistors 56 and 58 must sink enough current to pull their source 60 and 62 voltages from close to Vcc down to close to Vref1. This may take appreciable time as PMOS transistors 56 and 58 are relatively small devices.

Figure 3:
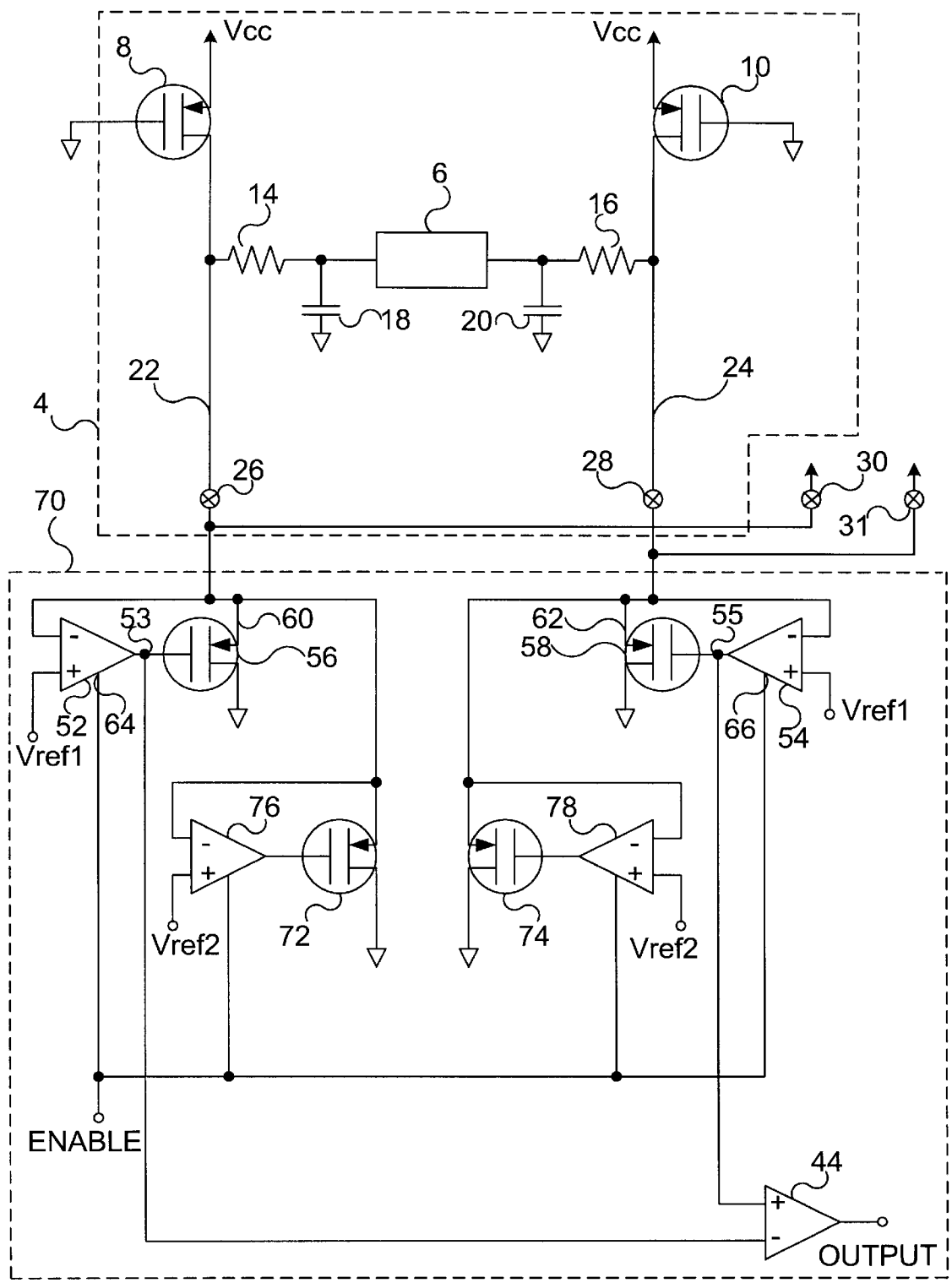
FIG. 3 shows a second embodiment of the invention.

This time can be shortened as shown in FIG. 3 by using the sense amplifier 70 according to the second embodiment of the invention. Sense amplifier 70 uses additional booster PMOS transistors 72 and 74 and corresponding operational amplifiers 76 and 78. Booster PMOS transistors 72 and 74 are fabricated to have relatively large current capacities even at the expense of having large areas. They are connected in the negative feedback loops of operational amplifiers 76 and 78 similarly to amplifiers 52 and 54. In this embodiment, operational amplifiers 52 and 54 have reference voltage Vref1 connected to their non-inverting inputs as above. New operational amplifiers 76 and 78 have reference voltage Vref2 connected to their non-inverting inputs, where Vcc>Vref2>Vref1. When the four operational amplifiers 52, 54, 76 and 78 are powered on, they turn on their respective PMOS transistors 56, 58, 72 and 74 because the node 60 and 62 voltages are higher than both Vref1 and Vref2. Due to the high current capacities of booster PMOS transistors 72 and 74, the node 60 and 62 voltages are quickly reduced below Vref2. When this happens, the operational amplifiers 76 and 78 turn off booster PMOS transistors 72 and 74. This allows the basic current-sensing amplifier circuits, PMOS transistors 56 and 58 and operational amplifiers 52 and 54, to reach equilibrium much more quickly than if the PMOS transistors 56 and 58 by themselves had to pull their source node voltages from near Vcc down to near Vref1.

Figure 4:
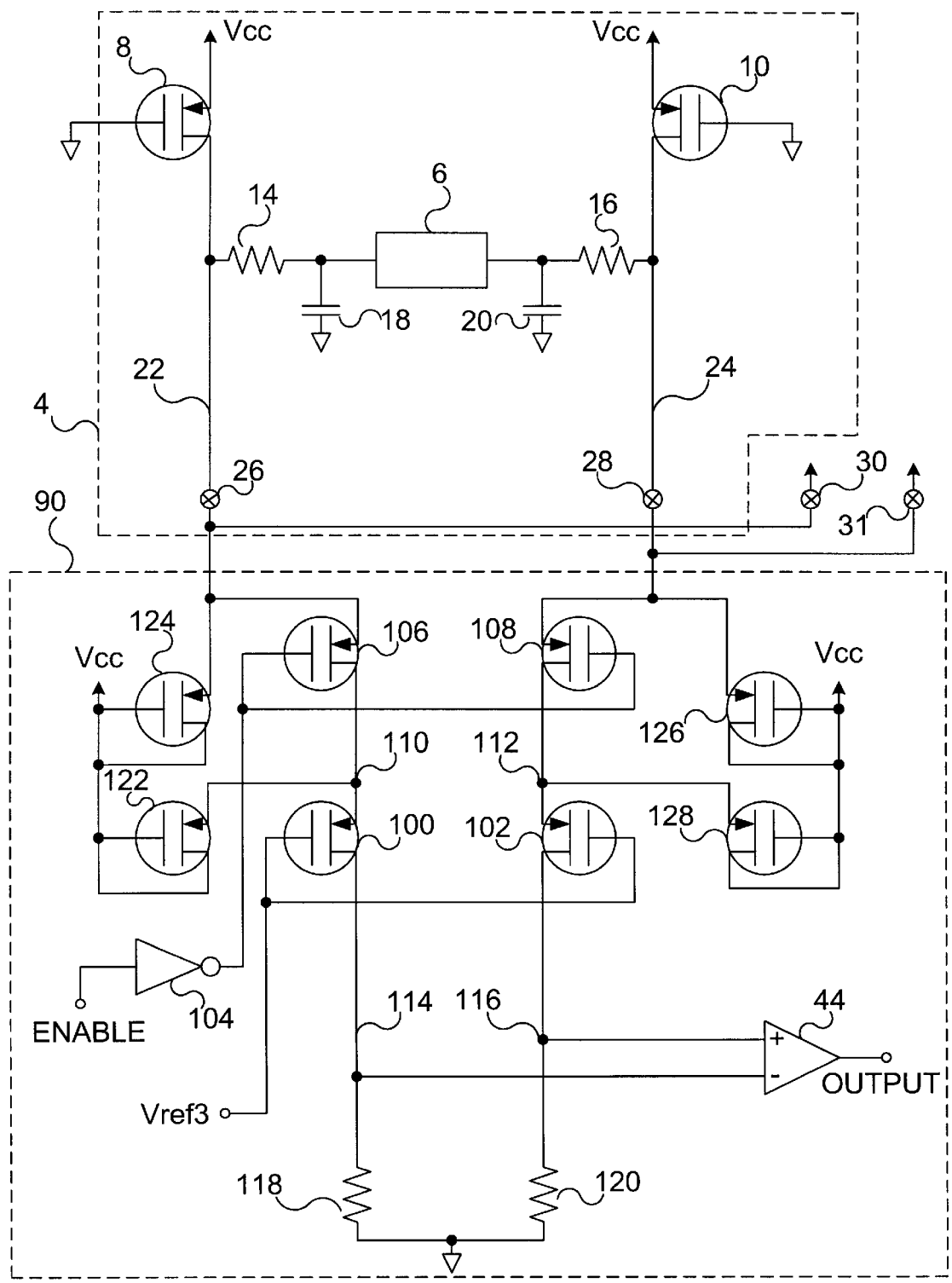
FIG. 4 shows a third embodiment of the invention.

FIG. 4 shows the invention in a third embodiment as sense amplifier 90, which dispenses with the feedback-controlling operational amplifiers. In this embodiment the cascoded PMOS transistors 100 and 102 are sized to be strong enough that they can replace the feedback amplifiers 52 and 54 of the first and second embodiments. The PMOS transistors 100 and 102 are sized sufficiently large so that their transconductance can limit the swing on bit line and bit line bar to about 50 mV. In this manner, current offsets are improved since they are introduced by the mismatch of two large PMOS transistors, rather than by two feedback amplifiers consisting of more than 4 transistors each. A precision process-compensated reference voltage Vref3 is needed to keep the common-mode voltage on nodes 114 and 116 steady over process and supply voltage variations. Assume that the enable signal on the ENABLE signal line is at high voltage (true), which upon inversion by digital inverter 104 presents a low voltage to the gates of, and turns on, enable PMOS transistors 106 and 108. When cascoded PMOS transistors 100 and 102 are suitably matched and their gates are held at Vref3, their source nodes 110 and 112 vary little from Vref1 of the prior embodiments. This achieves the same result as using operational amplifiers in the first and second embodiments. Since resistor matching tolerances are tighter than transistor matching tolerances, the slightly differing currents in cascoded PMOS transistors 100 and 102 are converted to voltages at nodes 114 and 116 by precision p-well resistors 118 and 120. Again in this embodiment the slightly differing voltages are compared by a voltage comparator 44 which produces a buffered digital output representing the state of the bistable memory cell 6.

This third embodiment requires certain subtleties in its implementation. The sense PMOS transistors 100 and 102 must be matched as closely as possible. A technique for assisting in matching sense PMOS transistors 100 and 102 uses two pairs of cross-coupled PMOS transistors (not shown) to form the one pair of sense PMOS transistors 100 and 102.

The precision p-well resistors 118 and 120 require similar care in this design. The nominal value of these resistors is 2600 ohms, but it is important that they be matched. It is also important to protect these resistors from stray currents, and thus multiple guard rings are used around them.

Figure 5:
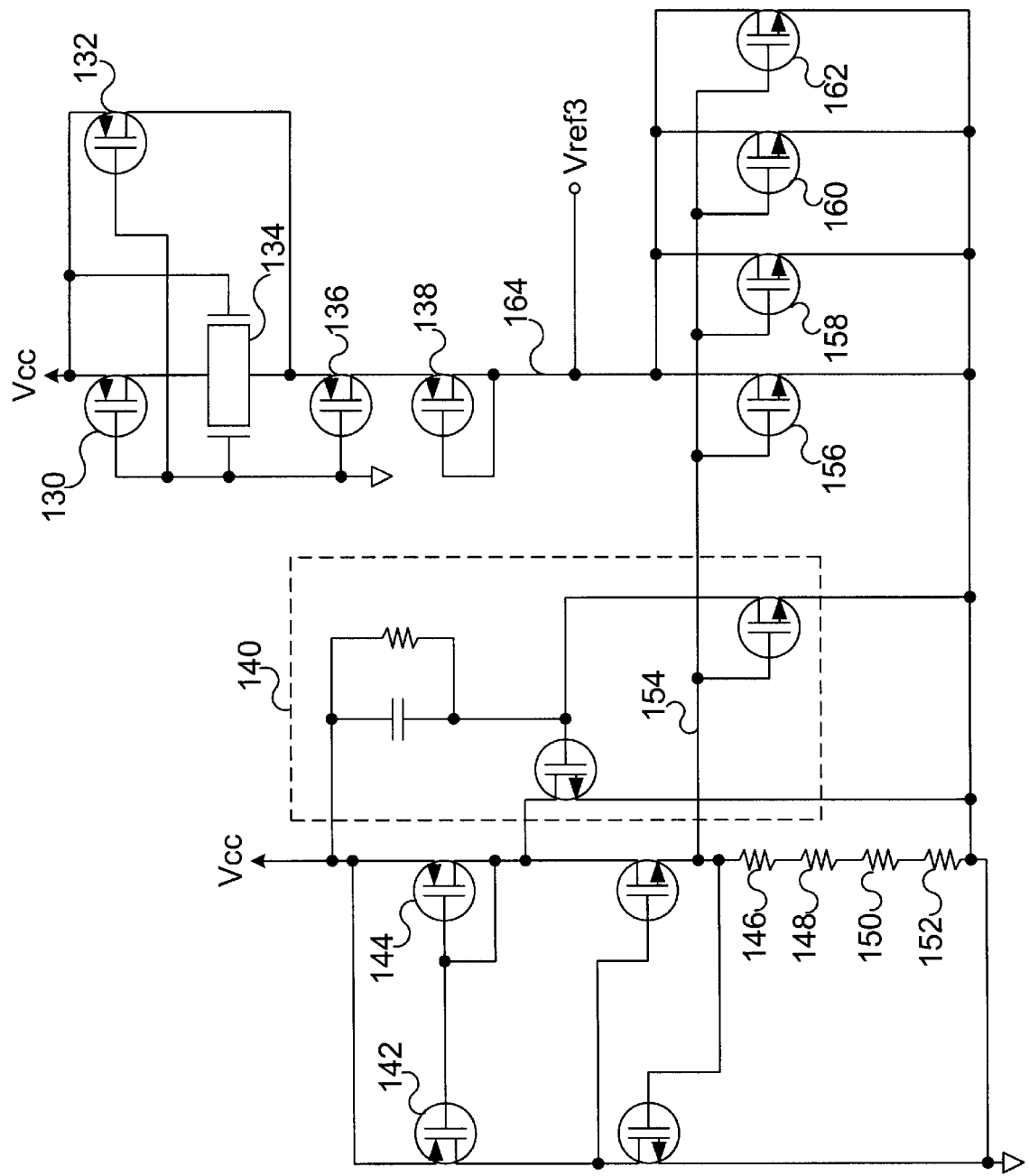
FIG. 5 shows a precision, process-compensated voltage reference for the third embodiment.

The precise and process-compensated reference voltage Vref3 must be generated in a manner which ensures that the current flowing through sense PMOS transistors 100 and 102 will not allow voltage fluctuations on the bit lines 22 and bit line bars 24. One method of generating Vref3, illustrated in FIG. 5, uses copies of the active circuit elements in the bistable latched memory element 4 and sense amplifier 90. Column pull-up copy PMOS transistor 130, column switch device copy 134, enable copy PMOS transistor 136, and sense copy PMOS transistor 138 are respectively copies of a representative column pull-up PMOS transistor 8, a column switch device 26, an enable PMOS transistor 106, and a sense PMOS transistor 100. When the current mirror formed by PMOS transistors 142 and 144 is initialized by power-up circuit 140, equal currents will flow through current mirror PMOS transistors 142 and 144. This constant current flows through the four series resistors 146, 148, 150 and 152, each of which is a copy of precision p-well resistors 118 and 120. The voltage at the circuit node 154 at the top of series resistors 146 through 152 is thereby compensated against supply voltage variations. Applying this voltage to the gates of matched current-to-voltage conversion NMOS transistors 156, 158, 160 and 162, the compensated current flowing thorough the circuit copy devices 130, 132, 134, 136 and 138, and the voltage conversion NMOS transistors 156 through 162 creates a process-compensated totem pole. The quantity of these NMOS transistors may change due to variations in process between manufacturers. The process-compensated current flowing through this totem pole provides a supply-voltage-compensated and process-compensated reference voltage Vref3 suitable for controlling the sense PMOS transistors 100 and 102 of the sense amplifier. Experiments show that the optimal setting for Vref3 is about 0.7 volts below that selected for Vref1, or about 0.9 volts below the supply voltage Vcc.

The exemplary embodiments described herein are for purposes of illustration and are not intended to be limiting. Therefore, those skilled in the art will recognize that other embodiments could be practiced without departing from the scope and spirit of the invention as defined by the claims set forth below.

What is claimed is:

1. A current-sensing sense amplifier for a memory device having a power supply voltage, comprising:
    a bitline data input terminal, a bitline complement data input terminal, a Vref1 input terminal, a ground terminal and a memory data signal output terminal;
    a first pair of PMOS transistors each having a source terminal connected to a respective one of said data input terminals, a drain terminal connected to said ground terminal, and a gate terminal;
    a first pair of operational amplifiers each having an output terminal connected to the gate terminal, and an inverting input terminal connected to the source terminal, of a respective one of said first pair of PMOS transistors, and a non-inverting input terminal connected to said Vref1 input terminal; and
    a voltage comparator having an inverting input terminal and a non-inverting input terminal each connected to the output terminal of a respective one of said operational amplifiers, and having an output terminal connected to said memory data signal output terminal.

2. A current-sensing sense amplifier as in claim 1 further comprising a first fixed reference voltage supply connected to said Vref1 input terminal.

3. A current-sensing sense amplifier as in claim 2 wherein the voltage of said first fixed reference voltage supply is substantially equal to 0.2 volts below said power supply voltage.

4. A current-sensing sense amplifier as in claim 2 further comprising:
    a Vref2 input terminal;
    a second pair of PMOS transistors each having a source terminal connected to a respective one of said data input terminals, a drain terminal connected to said ground terminal, and a gate terminal; and
    a second pair of operational amplifiers each having an output terminal connected to the gate terminal, and an inverting input terminal connected to the source terminal, of a respective one of said second pair of PMOS transistors, and a non-inverting input terminal connected to said Vref2 input terminal.

5. A current-sensing sense amplifier as in claim 4 further comprising a second fixed reference voltage supply connected to said Vref2 input terminal.

6. A current-sensing sense amplifier as in claim 5 wherein the voltage of said second reference voltage supply is between said first reference voltage and said power supply voltage.

7. A current-sensing sense amplifier as in claim 1 wherein each said operational amplifier has a power on/off enable input terminal, and powers on and off in response to different values of an enable signal being applied to said enable input terminal.

8. A current-sensing sense amplifier for a memory device having a supply voltage, comprising:
    a bitline data input terminal, a bitline complement data input terminal, a Vref3 input terminal, a ground terminal and a memory data signal output terminal;
    a pair of PMOS transistors each having a source terminal coupled to a respective one of said data input terminals, a drain terminal, and a gate terminal;
    a pair of resistors each having a first terminal connected to a respective one of said drain terminals and a second terminal connected to said ground terminal; and
    a voltage comparator having an inverting input terminal and a non-inverting input terminal each connected to the drain terminal of a respective one of said PMOS transistors, and having an output terminal connected to said memory data signal output terminal.

9. A current-sensing sense amplifier as in claim 8, further comprising a fixed reference voltage supply connected to said Vref3 input terminal.

10. A current-sensing sense amplifier as in claim 9, wherein the voltage of said fixed reference voltage is substantially equal to 0.9 volts below said power supply voltage.

11. A current-sensing sense amplifier as in claim 8 wherein said fixed reference voltage source is power-supply-voltage-and-process-compensated.

12. A current-sensing sense amplifier as in claim 11 wherein said power-supply-voltage-and-process-compensated fixed reference voltage source circuit includes a current mirror circuit for supply voltage compensation.

13. A current-sensing sense amplifier as in claim 11 wherein said power-supply-voltage-and-process-compensated fixed reference voltage source circuit includes a current source containing duplicate devices for process compensation.

14. A method of sensing the state of a bistable memory cell with complementary bit lines, comprising:
    connecting to the bit lines via column select switches;
    minimizing the voltage fluctuations at said column select switches by sinking the bit line currents through PMOS transistors driven by control means;
    converting the currents flowing through said PMOS transistors to voltages by sensing means; and
    comparing the resulting voltages by a voltage comparator.

15. The method of claim 14 wherein control means is negative feedback of two operational amplifiers.

16. The method of claim 15 wherein sensing means is output from said operational amplifiers.

17. The method of claim 14 wherein control means is a precision reference source.

18. The method of claim 17 wherein sensing means is two resistors.

* * * * *